United States Patent [19]
Torii

[11] Patent Number: 5,723,377
[45] Date of Patent: Mar. 3, 1998

[54] PROCESS FOR MANUFACTURING A SEMICONDUCTOR DEVICE INCLUDING A SILICIDATION STEP

[75] Inventor: Kouji Torii, Tokyo, Japan

[73] Assignee: NEC Corporation, Tokyo, Japan

[21] Appl. No.: 660,571

[22] Filed: Jun. 11, 1996

[30] Foreign Application Priority Data

Jun. 13, 1995 [JP] Japan ................................. 7-146185

[51] Int. Cl.$^6$ .................................................. H01L 21/336
[52] U.S. Cl. .......................... 438/303; 438/305; 438/307
[58] Field of Search ................................ 437/40, 41, 44, 437/60; 438/303–307

[56] References Cited

U.S. PATENT DOCUMENTS

| | | | |
|---|---|---|---|
| 4,690,730 | 9/1987 | Teng et al. | 437/200 |
| 5,089,432 | 2/1992 | Yoo | 438/305 |
| 5,130,266 | 7/1992 | Huang et al. | 438/305 |
| 5,179,034 | 1/1993 | Mori et al. | 437/41 |
| 5,340,761 | 8/1994 | Loh et al. | 438/305 |
| 5,352,631 | 10/1994 | Sitaram et al. | 437/44 |
| 5,401,666 | 3/1995 | Tsukamoto | 438/305 |
| 5,411,907 | 5/1995 | Yoo et al. | 438/305 |
| 5,491,099 | 2/1996 | Hsu | 437/200 |
| 5,496,750 | 3/1996 | Moslehi | 438/303 |
| 5,605,854 | 2/1997 | Yoo | 438/305 |
| 5,656,519 | 8/1997 | Mogami | 438/303 |
| 5,661,052 | 8/1997 | Inoue et al. | 438/303 |

FOREIGN PATENT DOCUMENTS 6-20078   3/1994   Japan .

OTHER PUBLICATIONS

Roger A. Haken, "Application of the self–aligned titanium silicide", *Journal Vacuum Sci. Technol.* B, vol. 3, No. 6, Nov./Dec. 1985, pp. 1657–1663.

V.Q. Ho et al., "Formation of self–aligned $TiSi_2$ for VLSI contacts and interconnects", *Journal vacuum Sci. technol.* A, vol. 5, No. 4, Jul./Aug. 1987, pp. 1396–1401.

Wolf et al, "Silicon Processing For The VLSI Era vol. 1: Process Technology", Lattice Press, pp. 187–191, 397–399, 516–519, 1986 month unknown.

*Primary Examiner*—John Niebling
*Assistant Examiner*—Michael S. Lebentritt
*Attorney, Agent, or Firm*—Young & Thompson

[57] ABSTRACT

A process for manufacturing a semiconductor device which prevents a short-circuit between a source region, a drain region and a gate electrode of a transistor. The process includes forming a sacrificial BPSG film on at least one of a top surface and a sidewalls of the gate electrode of the transistor, and forming a silicide film and removing the BPSG film by etching through a thin, incomplete, and unwanted silicide film formed on the BPSG film. In the step of removing the BPSG film, the unwanted silicide film formed on the BPSG film is also removed.

11 Claims, 4 Drawing Sheets

PROCESS FOR MANUFACTURING A SEMICONDUCTOR DEVICE INCLUDING A SILICIDATION STEP

BACKGROUND OF THE INVENTION

1. Field of the Invention

The present invention relates to a process for manufacturing a semiconductor device, and more particularly a process for manufacturing a metal-oxide semiconductor field-effect transistor (hereinafter, a MOSFET) which includes the step of siliciding source/drain regions and/or a gate electrode of the MOSFET.

2. Description of the Related Art

Recently, as MOSFETs have become more and more integrated and miniaturized, parasitic resistance in source/drain regions and a gate electrode of a MOSFET has emerged as a factor preventing speed increases of the semiconductor devices. To reduce such resistance, then, silicidation techniques have been employed in which a silicide film of a high melting point metal such as titanium (Ti) is formed on the source/drain regions and the gate electrode in a self-aligning manner.

In such silicidation, however, the silicidation occurs at not only the source/drain regions and the gate electrode but at a surface of sidewalls made of silicon oxide formed at both ends of the gate electrode. Therefore, there is a problem that a short-circuit between the source/drain regions and the gate electrode occurs through the silicide formed on the side walls.

To solve this problem, there has been proposed a method of covering the gate electrode with PSG before the silicidation is performed. According to this method, since the gate electrode is covered with PSG, the short-circuit between the source/drain regions and the gate electrode through the silicide formed on the side walls is prevented. Moreover, since PSG hardly forms silicide with a high melting point metal compared to silicon oxide, PSG formed on the gate electrode is not covered with the silicide. However, depending on the conditions during silicidation, there is a possibility that a very thin and incomplete silicide can form on the PSG, so that there is possibility that a short-circuit between the source region and the drain region occurs through such silicide formed on PSG.

This very thin and incomplete silicide formed on PSG is removed with an ammonia-hydrogen peroxide solution etch. While the silicide is removed so that the short-circuit can be prevented, there arises another problem that a layer resistance in the source/drain regions is increased because the silicide formed on the source/drain region is also etched.

SUMMARY OF THE INVENTION

It is, therefore, an object of the present invention to provide an improved process for manufacturing a semiconductor device including a silicidation step.

It is another object of the present invention to provide a process for manufacturing a semiconductor device which includes the step of siliciding source/drain regions and/or a gate electrode of a MOSFET while preventing a short-circuit between the source region and the drain region.

It is still another object of the present invention to provide a process for manufacturing a semiconductor device including silicidation of source/drain regions and/or a gate electrode of a MOSFET which does not require further steps to remove a silicide which can cause a short-circuit between the source region and the drain region.

A manufacturing process of semiconductor device according to the present invention comprises the steps of forming a first insulating film on a semiconductor substrate, forming a gate electrode on the first insulating film, forming a second insulating film on the gate electrode, forming source and drain regions in the semiconductor substrate, forming silicide films on the source and drain regions, and removing the second insulating film.

Thus, if a silicide is formed on the second insulating film formed on the gate electrode, since the second insulating film is removed, the silicide is completely removed together with the second insulating film so that the short-circuit through the silicide is prevented.

BRIEF DESCRIPTION OF THE DRAWINGS

This above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

Figure 1:
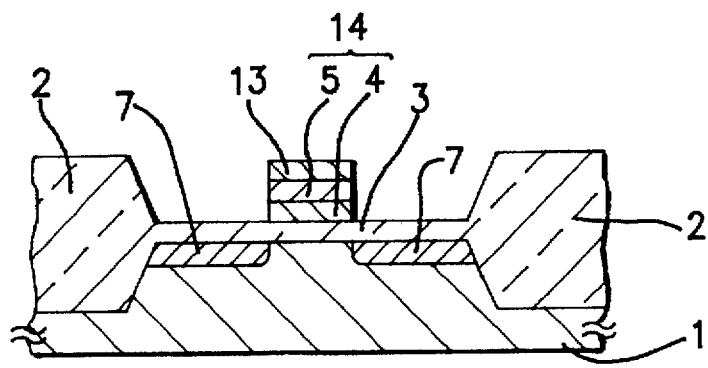
FIGS. 1 through 6 are sectional views of the sequence of manufacturing steps for illustrating one embodiment of the present invention.

First, one embodiment of the present invention will be explained with reference to FIGS. 1 through 6.

After a field insulation layer 2 made of a silicon oxide film is selectively formed on the main surface of a silicon substrate 1 to define an active region, a gate insulating film 3 is formed on the active region. Next, after a polysilicon film 4 is formed on the entire surface to a thickness of about 1,500 Å by a CVD process, heat treatment is conducted in ambient $POCl_3$ to implant about $10^{20}$ $cm^{-3}$ of phosphorus into the polysilicon film 4 to decrease resistance of the polysilicon film 4. Then, a silicide film 5 made of WSi (tungsten-silicide) is formed on the polysilicon film 4 to a thickness of about 1,500 Å by a sputtering process.

Subsequently, a BPSG film 13 is formed on the WSi film 5 to a thickness of about 2,000 Å. Preferably, the content of phosphorus in the BPSG film 13 is 4–5 mol % and the content of boron in the BPSG film 13 is 10 mol %. Such a BPSG film can be formed by the atmospheric CVD process, i.e., introducing TEOS (tetraethylorthosilicate) with flow rate of 3 SLM with nitrogen ($N_2$) bubbling, TMOP (trimethoxyphosphite) with flow rate of 1.4 SLM, TMOB (trimethoxyborate) with flow rate of 22 SCCM, oxygen ($O_2$) with flow rate of 7.5 SLM, and ozone ($O_3$) of 80 $g/m^3$ into a CVD apparatus at a temperature of about 400° C. A plasma CVD process and a low pressure CVD process can be also applied to form the BPSG film 13 in place of the atmospheric CVD process.

Then, to form a gate electrode 14, unnecessary areas of the BPSG film 13, the WSi film 5, and the polysilicon film 4 are removed by a photolithography process and a dry etching process. Next, using the gate electrode 14 and a remaining BPSG film 13 as an implant mask, the phosphorus is implanted about $3\times10^{13}$ $cm^{-3}$ to form lightly doped regions 7 with low concentration so as to form a lightly doped drain structure, as shown in FIG. 1.

Then, a silicon oxide film is formed on the entire surface in a thickness of about 1,500 Å by the CVD process.

Figure 2:
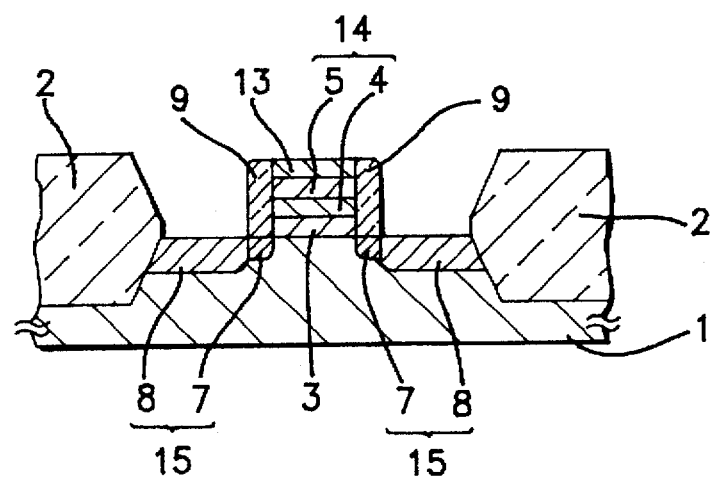

Subsequently, reactive ion etching is performed on the silicon oxide film to form the sidewalls 9 of the gate electrode 14. The BPSG film 13, in this etching, is also etched so that the thickness thereof is reduced to about 1,000 Å. Arsenic is then implanted about $2 \times 10^{15}$ cm$^{-3}$, using the gate electrode 14, BPSG film 13 and the sidewalls 9 as an implant mask, and heat treatment is conducted to form source/drain diffusion regions 15 which consist of the lightly doped regions 7 and heavily doped regions 8, as shown in FIG. 2.

Figure 3:
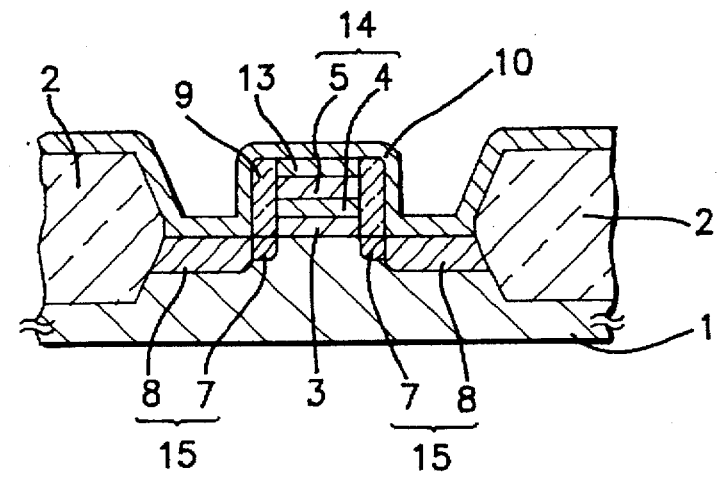

Than, as shown in FIG. 3, the titanium layer 10, as the high melting point metal film, is formed to a thickness of about 350 Å on the entire surface by the sputtering process.

Figure 4:
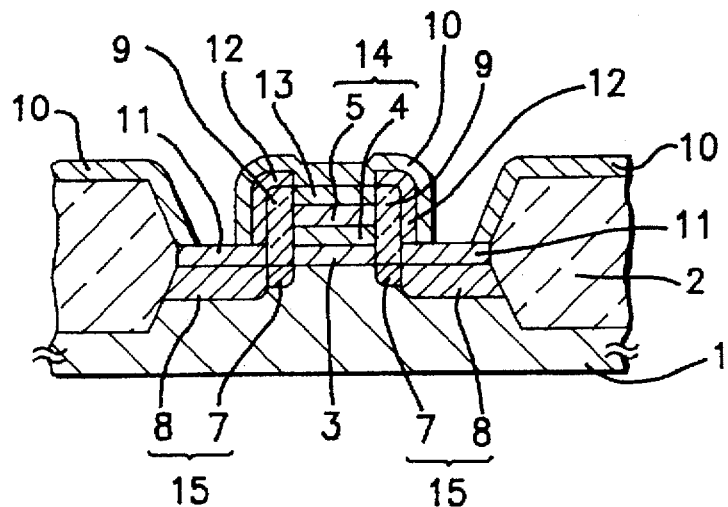

Heat treatment is then conducted at about 650° C. to form a TiSi$_2$ film 11 with C49 structure on the heavily doped regions 8 of the source/drain regions 15. In this heat treatment, since the sidewalls 9 made of silicon oxide have relatively weak Si-O bonds and have some uncoupled bonds of Si, layer 12 made of TiSi$_x$ is also formed on the sidewalls 9. However, since the field insulation layer 2 also made of silicon oxide has very few uncoupled bonds of Si, the TiSi$_x$ layer is not formed on the field insulation layer 2, as shown in FIG. 4.

On the other hand, although BPSG hardly forms TiSi$_x$ with high melting point metal same as PSG, depending on a condition of silicidation, i.e., on a condition of heat treatment, there is a possibility that a very thin and incomplete TiSi$_x$ film is formed on the BPSG film 13 same as PSG. Treatment of such TiSi$_x$ film will be explained later.

Figure 5:
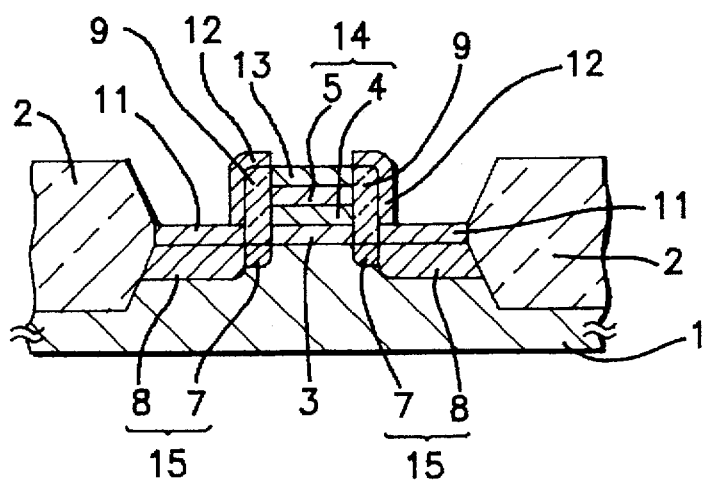

Then, to remove the unreacted titanium film 10 formed on the gate electrode 14 and the field insulation layer 2, the wafer is dipped into a sulfuric acid/hydrogen peroxide solution. Preferably, the mixing ratio of sulfuric acid to hydrogen peroxide is 4:1, and the temperature of the solution is about 130° C. When the wafer is dipped for about 10 minutes, the unreacted titanium layer 10 is completely removed, as shown in FIG. 5.

Figure 6:
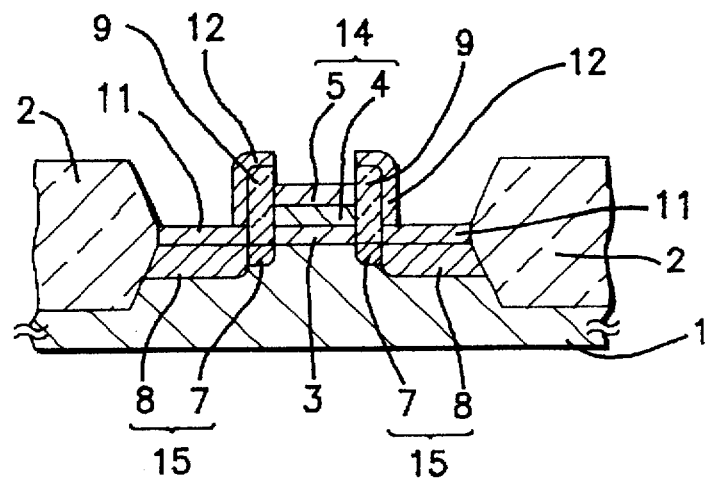

Moreover, the sulfuric acid/hydrogen peroxide solution can also etch the BPSG film 13. An etching rate of the BPSG film 13 against the solution is 30–40 Å/min. As described above, the TiSi$_x$ film is hardly formed on the BPSG film 13, and even if it exist, it is very thin and incomplete. That is, the TiSi$_x$ film does not cover an entire surface of the BPSG film 13, and therefore the BPSG film ! 3 is only partially covered with the TiSi$_x$ film. In other words, this TiSi$_x$ film has many openings. Accordingly, when the wafer is dipped into the sulfuric acid/hydrogen peroxide solution for a prolonged period of time, for example, about one hour the solution penetrates into the BPSG film 13 through the openings of the TiSi$_x$ film, and the BPSG film 13 is gradually etched and removed. The TiSi$_x$ film formed on the BPSG film 13 is thus removed together with the BPSG film 13. In other words, the lifting-off of the BPSG film 13 removes the TiSi$_x$ film, as shown in FIG. 6.

To remove the unreacted titanium layer 10 and the undesirable TiSi$_x$ film formed on the BPSG film 13, a hydrochloric acid/hydrogen peroxide solution may be utilized instead of the sulfuric acid/hydrogen peroxide solution.

Next, heat treatment is conducted at about 900° C. to phase change the TiSi$_2$ layer 11 on the source/drain regions 15 to a C54 structure with low resistance. Thereafter, an inter-layer insulation film is formed as in the conventional manufacturing process of MOSFETs, and contact holes are formed through the inter-layer insulation film to connect wiring so that an N-channel MOSFET having a silicide layer on the surface of source/drain regions 15 is obtained (not shown).

In the removing step using the sulfuric acid/hydrogen peroxide solution or the hydrochloric acid/hydrogen peroxide solution, the reduction of the thickness of the TiSi$_2$ layer 11 is only several tens of angstrome. This is because titanium oxide or silicon oxide is formed on the surface of the TiSi$_2$ layer 11 by oxidation of the solution so that such oxide prevents the solution from etching the TiSi$_2$ layer 11. Therefore, after this titanium oxide or silicon oxide is formed, the effect of the element is significantly reduced so that the thickness of the TiSi$_2$ layer 11 is substantially maintained even if the wafer is dipped in the solution for a prolonged period of time such as one hour to remove the BPSG film 13. Thus, the reduction of thickness of the TiSi$_2$ layer 11 can be suppressed so that an increase of the layer resistance of the source/drain region 15 is prevented.

Moreover, in this embodiment, it may be sufficient that the sidewalls 9 be constituted by a BPSG film. In this case, the film 13 may be constituted by a film other than BPSG, such as PSG or silicon oxide because the sidewalls 9 are removed by the removing step using the sulfuric acid/hydrogen peroxide solution or the hydrochloric acid/hydrogen peroxide solution.

Next, another embodiment will be explained with reference to FIGS. 7 through 12.

Figure 7:
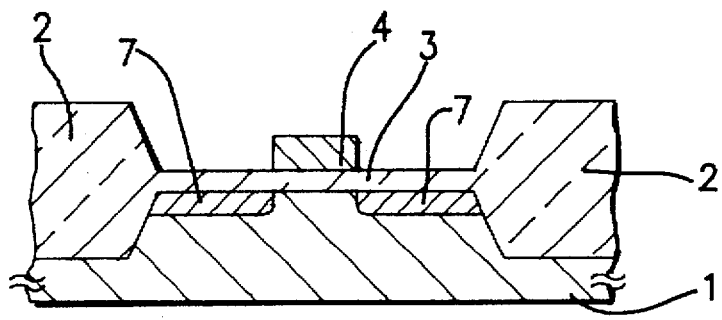
FIGS. 7 through 12 are sectional views of the sequence of manufacturing steps for illustrating another embodiment of the present invention.

A field insulation layer 2 made of a silicon oxide film is selectively formed on the main surface of a silicon substrate 1 to define an active region. Then, a gate insulating film 3 is formed on the active region, and a polysilicon film 4 is formed on the entire surface to a thickness of about 1,500 Å by a CVD process. Next, heat treatment is conducted in ambient POCl$_3$ to implant about $10^{20}$ cm$^{-3}$ of phosphorus into the polysilicon film 4 to decrease the resistance of the polysilicon film 4. Subsequently, unnecessary areas on the polysilicon film 4 are removed by the photolithography process and the dry etching process to obtain a gate electrode structure. Then, using the remaining polysilicon film 4 as an implant mask, the phosphorus is implanted about $3 \times 10^{13}$ cm$^{-}$ to form lightly doped regions 7 with low concentration so as to form an LDD structure, as shown in FIG. 7.

Figure 8:
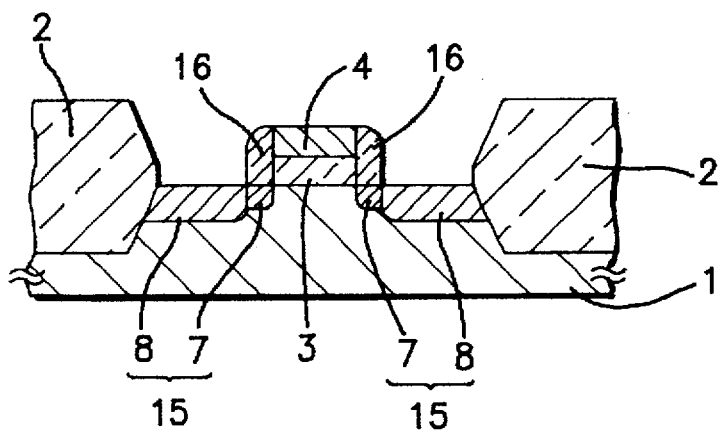

Then, a BPSG film is formed on the entire surface to a thickness of about 1,500 Å by the CVD process. Subsequently, the reactive ion etching is performed on the BPSG film to form the sidewalls 16. Arsenic is then implanted to about $2 \times 10^{15}$ cm$^{-3}$, using the remaining gate insulating film 3 and polysilicon film 4 and the sidewalls 16 as an implant mask, and heat treatment is conducted to form source/drain diffusion regions 15 which consist of the lightly doped regions 7 and heavily doped regions 8, as shown in FIG. 8.

Figure 9:
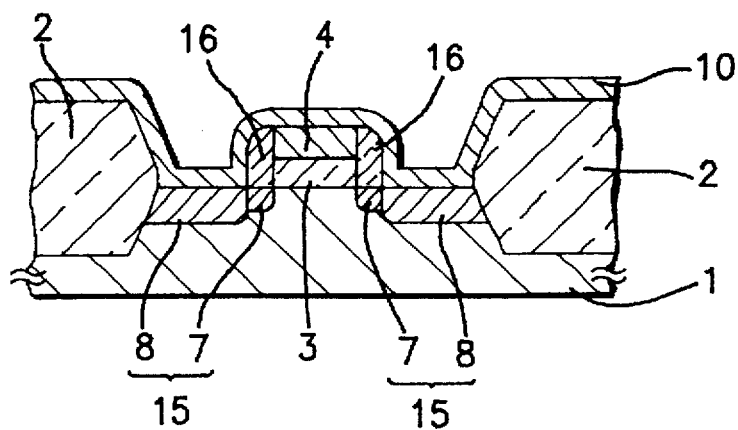

Then, as shown in FIG. 9, the titanium layer 10, as the high melting point metal film, is formed to a thickness of about 350 Å on the entire surface by the sputtering process.

Figure 10:
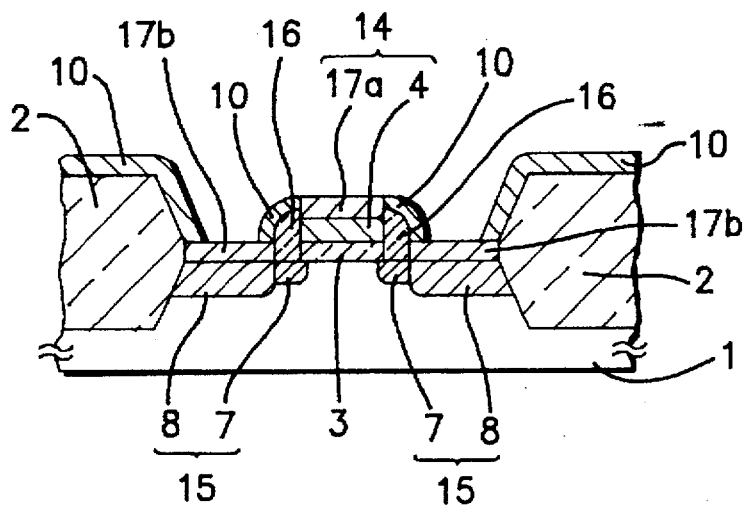

Heat treatment is then conducted at about 650° C. to form a TiSi$_2$ film 17b with C49 structure on the heavily doped regions 8 of the source/drain regions 15. In this heat treatment, a gate silicide film 17a is also formed on the remaining polysilicon film 4 to form a gate electrode ! 4, as shown in FIG. 10. However, a silicide layer is hardly formed on the field insulation layer 2 and the sidewalls 16 for the aforementioned reasons.

Figure 11:
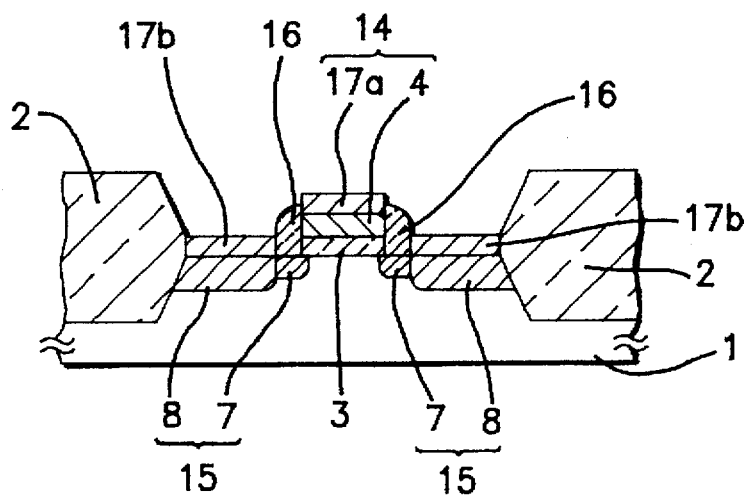

Then, to remove the unreacted titanium film 10 formed on the sidewalls 16 and the field insulation layer 2, the wafer is dipped into the sulfuric acid/hydrogen peroxide solution or the hydrochloric acid/hydrogen peroxide solution. When the wafer is dipped for about 10 minutes, the unreacted titanium layer 10 is completely removed, as shown in FIG. 11.

Figure 12:
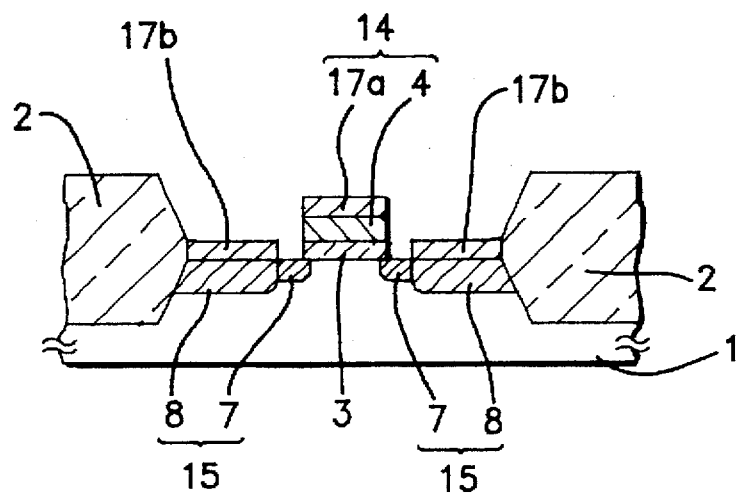

Furthermore, for the aforementioned reasons, each of the solutions also etches and removes the sidewalls 16 made of BPSG in about one hour even if the silicide was undesirably formed on the sidewalls 16 during the heat treatment. Therefore, the sidewalls 16 made of BPSG are also removed, as shown in FIG. 12.

Then, heat treatment is conducted at about 900° C. to phase change the $TiSi_2$ layer 17b to a C54 structure with low resistance. Thereafter, similar to the aforementioned embodiment, an inter-layer insulation film is formed as in the conventional manufacturing process of MOSFET, and contact holes are formed through the inter-layer insulation film to connect wiring so that an N-channel MOSFET having a silicide layer in the gate electrode 14 and on the surface of source/drain regions 15 is obtained (not shown).

Therefore, in addition to the advantages similar to the aforementioned embodiment, this embodiment has further advantages, in that the manufacturing process is simple so that the yield of the devices can be improved.

While the preferred embodiments of the present invention have been described, the present invention can be applied not only to an N-channel MOSFET, but also to a silicidation for a P-channel MOSFET or CMOSFET. Furthermore, it can be also applied to a MOSFET with a more common structure than the LDD structure. That is, it is apparent that the present invention is not limited to the above embodiments but may be changed and modified without departing from the scope and spirit of the invention.

What is claimed is:

1. A method for manufacturing a semiconductor device comprising the steps of:

forming a first insulating film on a semiconductor substrate;

forming a first conductive film on said first film;

forming a first silicide film on said first conductive film;

forming a second insulating film on said first silicide film;

forming a gate electrode by etching said first conductive film, first silicide film, and second insulating film;

forming source and drain regions by using said gate electrode as an implant mask;

forming a second conductive film on said gate electrode and said source and drain regions;

forming a second silicide film on said source and drain region by heating said second conductive film; and removing said second conductive film and said second insulating film by using an etchant.

2. The method as claimed in claim 1, wherein said second insulating film comprises one of BPSG and PSG.

3. The method as claimed in claim 2, wherein said etchant comprises one of a sulfuric acid/hydrogen peroxide and a hydrochloric acid/hydrogen peroxide.

4. The method as claimed in claim 3, wherein said first conductive film comprises polysilicon.

5. The method as claimed in claim 4, wherein said first silicide film comprises tungsten-silicide.

6. The method as claimed in claim 5, wherein said second conductive film comprises a high melting point metal.

7. The method as claimed in claim 6, wherein said high melting point metal comprises titanium.

8. A process of removing from a first surface of a semiconductor device an unwanted silicide layer which is formed when a silicide layer is formed on second surfaces of the device by reacting a high, melting point metal with a semiconductor material at the second surfaces, the method comprising the steps of:

forming a sacrificial BPSG layer on the first surface of the semiconductor device before formation of the unwanted silicide layer thereon;

forming a layer of the high melting point metal on first and second surfaces of the device;

treating the device with heat to react the high melting point metal with the semiconductor material at the second surfaces to form a silicide on the second surfaces, the heat treatment also forming a thin and incomplete layer of unwanted silicide on the sacrificial BPSG layer; and in a single step, continuously etching with a first etchant to remove unreacted portions of the high melting point metal from the first and second surfaces of the device and to etch the sacrificial BPSG layer through the incomplete layer of unwanted silicide to remove the sacrificial BPSG layer and the unwanted silicide thereon in order to remove the unwanted silicide layer from the first surface, the silicide on the second surfaces being protected by oxidation to prevent substantial change in a thickness thereof.

9. The process of claim 8, wherein the first surface is a surface of a gate electrode and the second surfaces comprise surfaces of at least one of source and drain regions and sidewalls of the gate electrode.

10. The process of claim 9, wherein the gate electrode is formed by forming a polysilicon film on an insulating film on the device and forming a gate silicide on the polysilicon film, wherein an exposed surface of the gate silicide is the first surface.

11. The process of claim 8, wherein the first etchant comprises at least one of a sulfuric acid/hydrogen peroxide solution and a hydrochloric acid/hydrogen peroxide solution.

* * * * *